(12) United States Patent
Hellinger et al.

(10) Patent No.: US 7,746,650 B2
(45) Date of Patent: Jun. 29, 2010

(54) ARRANGEMENT FOR COOLING SMD POWER COMPONENTS ON A PRINTED CIRCUIT BOARD

(75) Inventors: Leopold Hellinger, Ziersdorf (AT); Gerhard Neumann, St. Margarethen (AT)

(73) Assignee: Siemens AG Oesterreich, Vienna (AT)

( * ) Notice: Subject to any disclaimer, the term of this patent is extended or adjusted under 35 U.S.C. 154(b) by 211 days.

(21) Appl. No.: 11/789,929

(22) Filed: Apr. 26, 2007

(65) Prior Publication Data

US 2007/0206357 A1    Sep. 6, 2007

(30) Foreign Application Priority Data

May 16, 2006    (AT)  ................................ A 846/2006

(51) Int. Cl.
*H05K 7/20*      (2006.01)
*H01L 23/26*     (2006.01)
*H01L 23/34*     (2006.01)
*F28F 7/00*      (2006.01)

(52) U.S. Cl. ....................... 361/719; 361/709; 361/720; 361/721; 174/16.3; 257/713; 257/722; 165/80.3; 165/185

(58) Field of Classification Search ................. 361/704, 361/709–710, 719–720; 174/15.1, 16.1, 174/16.3; 257/712–713, 721–722; 165/80.2, 165/80.3, 185
See application file for complete search history.

(56) References Cited

U.S. PATENT DOCUMENTS

| | | | | |
|---|---|---|---|---|
| 3,670,215 | A * | 6/1972 | Wilkens et al. | 257/718 |
| 4,552,206 | A * | 11/1985 | Johnson et al. | 165/80.3 |
| 4,625,260 | A * | 11/1986 | Jordan et al. | 361/720 |
| 4,945,401 | A * | 7/1990 | Trunk et al. | 257/718 |
| 5,311,395 | A * | 5/1994 | McGaha et al. | 361/720 |
| 5,917,701 | A * | 6/1999 | Solberg | 361/704 |
| 6,053,240 | A * | 4/2000 | Johnston et al. | 165/80.3 |
| 6,707,676 | B1 * | 3/2004 | Geva et al. | 361/719 |
| 7,286,361 | B2 * | 10/2007 | Yamanaka | 361/704 |
| 2004/0042177 | A1 * | 3/2004 | Geva et al. | 361/705 |

FOREIGN PATENT DOCUMENTS

| | | |
|---|---|---|
| DE | 199 10 500 A1 | 10/2000 |
| DE | 43 32 115 B4 | 6/2004 |

* cited by examiner

*Primary Examiner*—Zachary M Pape

(57) ABSTRACT

There is described an arrangement for cooling electrical components disposed on a board-shaped mounting substrate, particularly SMD power components on a printed circuit board, wherein at least one heat sink assigned to a component is present which is disposed on the same side as the components and which is connected in a thermally conductive manner to the assigned component by means of a thermally conductive layer implemented on the mounting substrate. The heat sink is implemented as a bent sheet-metal part and is connected to the thermally conductive layer by means of a solder joint, wherein the bent sheet-metal part has at least one heat sink element which extends in a longitudinal direction and said longitudinal direction is oriented obliquely to the plane of the board-shaped substrate.

20 Claims, 3 Drawing Sheets

US 7,746,650 B2

ARRANGEMENT FOR COOLING SMD POWER COMPONENTS ON A PRINTED CIRCUIT BOARD

CROSS REFERENCE TO RELATED APPLICATIONS

This application claims priority of Austrian application No. A846/2006 filed May 5, 2004, which is incorporated by reference herein in its entirety.

FIELD OF INVENTION

The invention relates to an arrangement for cooling components disposed on a board-shaped mounting substrate, in particular SMD (Surface Mount Device) power components on a printed circuit board, there being at least one heat sink which is disposed on the component side and which is connected in a thermally conductive manner to an associated component by means of a thermally conductive layer implemented on the mounting substrate.

BACKGROUND OF INVENTION

Various heat dissipation concepts for cooling power components mounted using surface mount technology (SMT) are known. The heat can be dissipated by heat sinks which are disposed either on the component side or on the back of the printed circuit board.

DE 43 32 115 B4 discloses a printed circuit board cooling arrangement using a heat sink disposed on the component side. An electrically insulating but thermally conducting adhesive foil connects the heat sink to the conductor tracks leading to the SMD component. However, the thermally conductive adhesive foil itself possesses a thermal resistance. The application of the adhesive foil requires an additional manufacturing step. The cooling fins are perpendicular to the plane of the component side of the printed circuit board. For natural convection, cooling is therefore dependent on the position in space of the printed circuit board.

An electrical device comprising a printed circuit board on which the SMD components are cooled by a heat sink on the underside of the printed circuit board is disclosed in DE 199 10 500 A1. By means of thermal vias, the heat dissipated on the component side is conducted to the back of the printed circuit board. The provision of thermal vias likewise constitutes an increased printed circuit board manufacturing cost.

These known heat removal concepts are costly in manufacturing terms and also have the disadvantage that heat dissipation by natural convection is dependent on the mounting position. Under worst case conditions a hot spot may occur which can impair the operational capability of the SMD circuit.

SUMMARY OF INVENTION

An object of the present invention is to specify an arrangement for cooling SMD power components in which the heat sinking capability is as little dependent on the mounting position as possible and which is as simple and inexpensive to manufacture as possible.

This object is achieved by an arrangement having the features set forth in an independent claim. Advantageous embodiments are the subject matter of dependent claims.

The invention is based on the recognition that heat removal that is largely independent of mounting position can be achieved by a heat sink having heat dissipating elements oriented obliquely to the printed circuit board. In other words, the parts of the heat sink critical for dissipating heat to the ambient air are not oriented horizontally or vertically with respect to the plane of the board, but laterally inclined. This reduces the positional dependence of the cooling effect, with a resulting improvement in the reliability of the circuit realized in SMD technology. The heat dissipating elements implemented obliquely to the printed circuit board plane can be inexpensively manufactured as bent sheet-metal parts. The parts of the heat sink that are critical for dissipating heat to the ambient air can be finger-shaped or planar. According to the invention, the bent sheet-metal part is soldered to a heat conducting or heat distributing layer on which the component to be cooled is mounted.

The bent sheet-metal part can be automatically handled by "pick and place" machines in the same way as an SMD component, thereby enabling the entire cooling arrangement to be manufactured inexpensively.

A manufacturing-friendly embodiment of the bent sheet-metal part can be characterized in that it has a section bent in a U-shape, the legs of which are soldered to the thermally conductive layer. The heat sink elements are formed by bent sheet-metal sections on each end face of the U-shaped section.

Very efficient heat dissipation can be achieved by a design in which the heat sink elements are planar and have heat dissipating surfaces which form an acute angle with the plane of the board-shaped mounting substrate.

For this design it may be advantageous to make the planar heat sink elements T-shaped with angled end pieces.

Another advantageous embodiment can be characterized in that the heat sink elements are implemented as cooling fingers which fan out into the half space of the mounting substrate above the plane of the component side.

It may be advantageous for the automatic soldering process if the bent sheet-metal part is coated with a solderable surface such as a tin, nickel or white bronze coating, or is made of a solderable material.

Also favorable for manufacture is an arrangement in which the heat sink with its two legs forming a U is adjacent to the sides of the cuboidal SMD power component on which there are no terminal contacts. This enables the soldering-in-place of the bent sheet-metal parts to be combined with the soldering of the electrical terminal contacts.

For automatic "pick and place" handling it may be advantageous if the U-bent sheet-metal part has a flat side so that a suction arm of an automatic SMD insertion machine can grip and transport the bent sheet-metal part securely.

A particularly inexpensive embodiment of the invention may be characterized in that the bent sheet-metal part consists of copper sheet and is produced by punch-bending.

BRIEF DESCRIPTION OF THE DRAWINGS

For further explanation of the invention, reference will be made in the following section of the description to the drawings which illustrate further advantageous embodiments, details and development of the invention and in which.

DETAILED DESCRIPTION OF INVENTION

Figure 1:
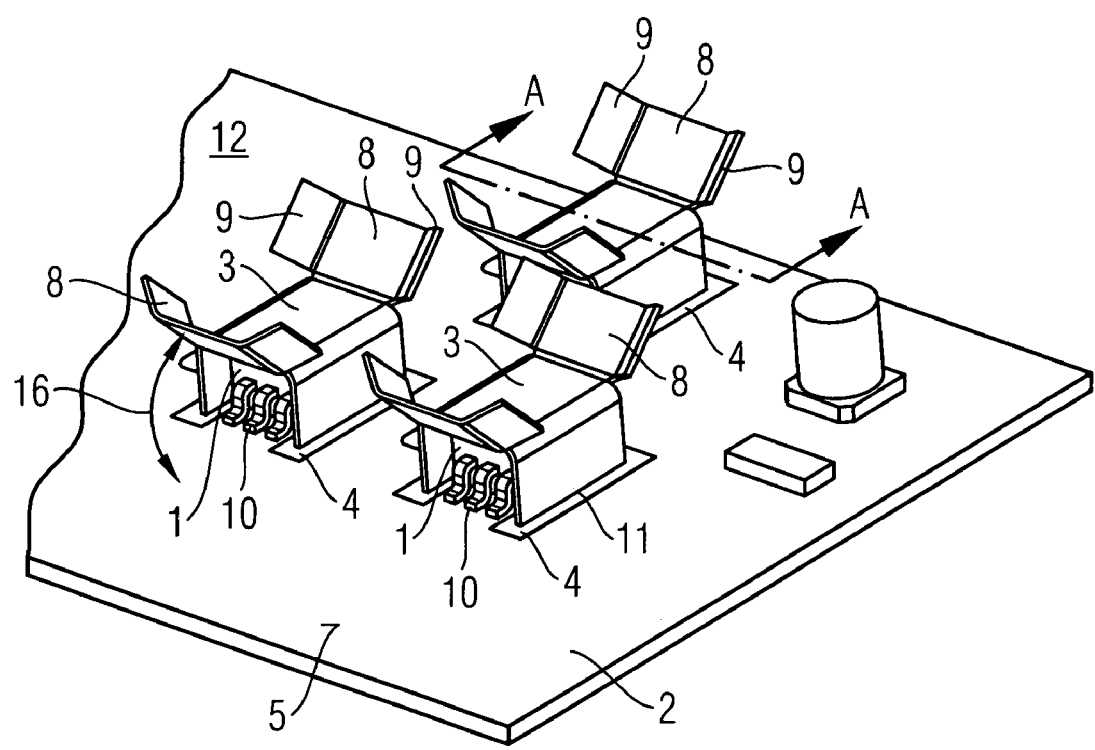
FIG. 1 shows a perspective view of an inventive arrangement for cooling SMD power components on a board-shaped mounting substrate.

FIG. 1 shows an example of the inventive cooling arrangement, as used for a dimmer control in electrical installations (EIB bus).

Power components 1 are surface-mounted on a component side 5 of a printed circuit board 2. These SMD components have terminal contacts 10 which are electrically connected to conductor tracks not shown in greater detail here. Each SMD power component 1 in FIG. 1 is mounted in a thermally conductive manner on a heat conducting or distributing layer 4 which is implemented on the mounting surface 5, the thermally conductive layer 4 having the shape of a double-T. A U-shaped heat sink 3 disposed on the same side of the mounting substrate 2 as the components 1 forms a kind of tunnel around each of these SMD power components 1. The heat sink 3 is formed from a copper sheet in one piece. This bent sheet-metal part is preferably made by punch-bending.

Figure 2:
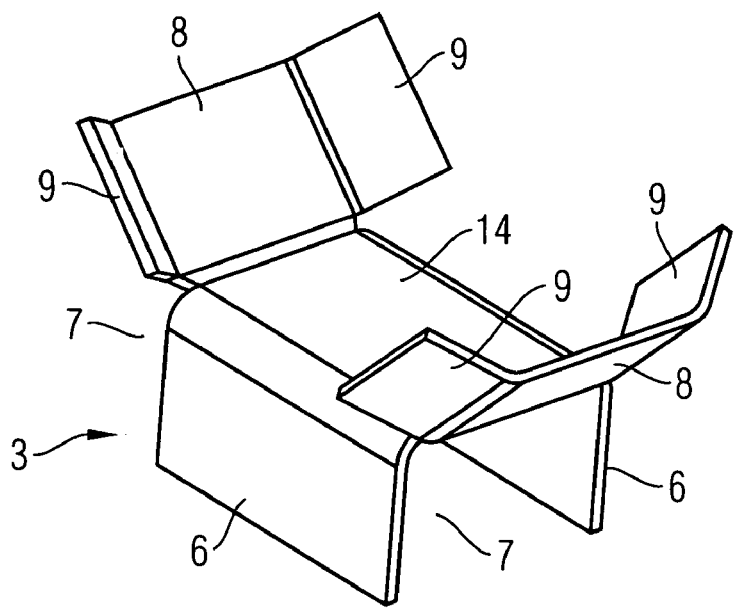
FIG. 2 shows a three-dimensional view of a heat sink as used in the inventive arrangement according to FIG. 1.

FIG. 2 shows this bent sheet-metal part 3 separately in a 3D drawing. It essentially consists of a U-shaped section 15 comprising the two legs 6 and a flat side 14. On this U-shaped section 15 there is implemented on one end face 7 a heat sink element 8 in the form of a T-shaped sheet-metal tab. The tab 8 is bent upward relative to the plane 5 and itself in turn has at either end an end piece 9 which is bent relative to the central part of each tab 8.

Figure 3:
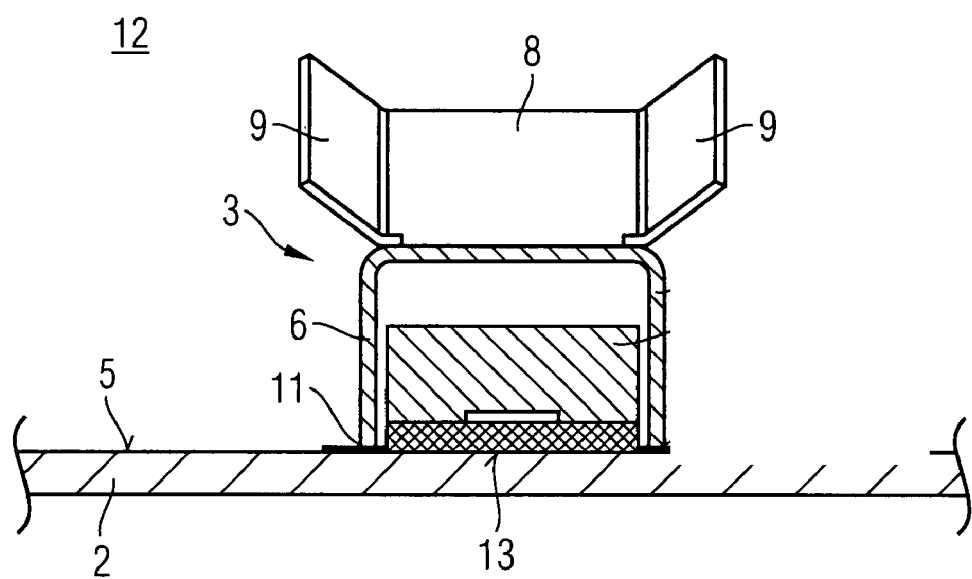
FIG. 3 shows a section through an SMD component with a heat sink disposed thereabove corresponding to the line A-A in a detail of FIG. 1.

As may best be seen from FIG. 3, in a mounting position the two legs 6 of the U-shaped section 15 of the bent sheet-metal part 3 are soldered to the thermally conductive layer 4 by means of a solder joint 11 in each case. The heat dissipated during operation of an SMD power component 1 thus flows via the thermal contact pad 13 to the thermally conductive layer 4. From there the heat flow is distributed into the double-T sections. Via the solder joint 1, the heat flows into the legs 6 of the heat sink 3 and passes from there into the heat sink elements 8 designed for convective heat exchange. The heat sink elements 8 are shaped like "wings" pointing upward from the end face 7 of the U-shaped section 15 into the half space 12. These "wings" are formed by the two tabs 8 of the bent sheet-metal part 3. Each of these tabs 8 forms an acute angle 16 with the plane 5 of the substrate 2, i.e. each tab 8 together with the two end pieces 9 points upward into the half space 12. The two tabs 8 of a heat sink can form different angles with the plane 5.

As the heat sink 3 is disposed on the side of mounting substrate 2 containing the components 1, the heat is dissipated from the side where it arises; expensive-to-manufacture thermal vias are not required.

On the one hand, a good heat dissipation effect is achieved by the illustrated design of the heat sink 3. This effect is less dependent on the spatial position of the mounting substrate 1 than in the case of a heat sink implemented as an extruded profile, thereby allowing any hot spot to be effectively counteracted. The heat flow from the component 1 to the heat sink 3 does not need to overcome the thermal resistance of an adhesive layer, which means a lower temperature in the printed circuit board 2. The enables the reliability of an SMD-type electronic circuit to be improved. On the other hand, the heat sink 3 made from a bent sheet-metal part can be inexpensively manufactured in high volumes, e.g. by means of a follow-on composite tool. This is of major benefit for large-scale production, conferring a weight advantage and material saving compared to a heat sink produced as an extruded profile.

A further advantage emerges for the manufacture of the SMD circuit. The heat sink 3 is handled and placed similarly to an SMD device: the heat sinks 3 are fed to the pick-and-place machine in conventional packing by means of a tape or similar. The vacuum suction nozzle of the pick-and-place machine grips a heat sink 3 on the tape by the flat side 14 and positions it on the mounting substrate 2 on the double-T edge areas of the thermally conductive layer 4, these being provided with soft solder. The solder joint 11 with the pressed-on soldering paste can then be made in the usual manner by what is referred to as the reflow soldering process. Reflow soldering is a soft soldering process in which the soft solder is applied to the board prior to component insertion. The components are then placed in position. In a third step heat is applied. This can be effected in different ways, e.g. by means of infrared radiation, laser radiation, heated air or using a hotplate.

The heat sink 3 is mechanically attached to the mounting substrate 2 exclusively by means of the solder joint 11. As shown in FIG. 1, the legs 6—and therefore the solder joint 11—are adjacent to the sides of the cuboidal component 1 on which no terminal contacts 10 are implemented, i.e. to which no conductor tracks lead. The solder joint 11 can therefore be manufactured in the same operation as the electrical solder joints 11 between conductor tracks and terminal contacts 10. It is not necessary to apply either an adhesive or any other means of attaching the heat sink 3.

The manufacture of the cooling arrangement according to the invention therefore requires minimal modification of existing SMD pick-and-place machines.

Self-evidently it is also possible to first solder the electrical components using a high melting point solder paste and then, in a second step, to solder the heat sink 3 using a low melting point solder paste.

To improve heat dissipation to the ambient air, the planar shaped heat sink element 8 in the present example can also have slotted holes or comprise finger-shaped fins splayed out in the manner of a fan.

The bent sheet-metal part is made from copper sheet. After non-cutting shaping, the bent sheet-metal part is tinned to prevent the formation of an oxide layer which would impair the making of the solder joint 11. Other readily solderable materials or coatings are obviously also possible.

In the present exemplary embodiment the thermally conductive layer 4 is a copper-clad layer implemented on the component side 5. However, the thermally conductive layer 4 can also be implemented differently, e.g. by a laminated-on metal layer, or by a press-in part mounted in an opening or recess of the mounting substrate 2 by means of an interference fit.

Figure 4:
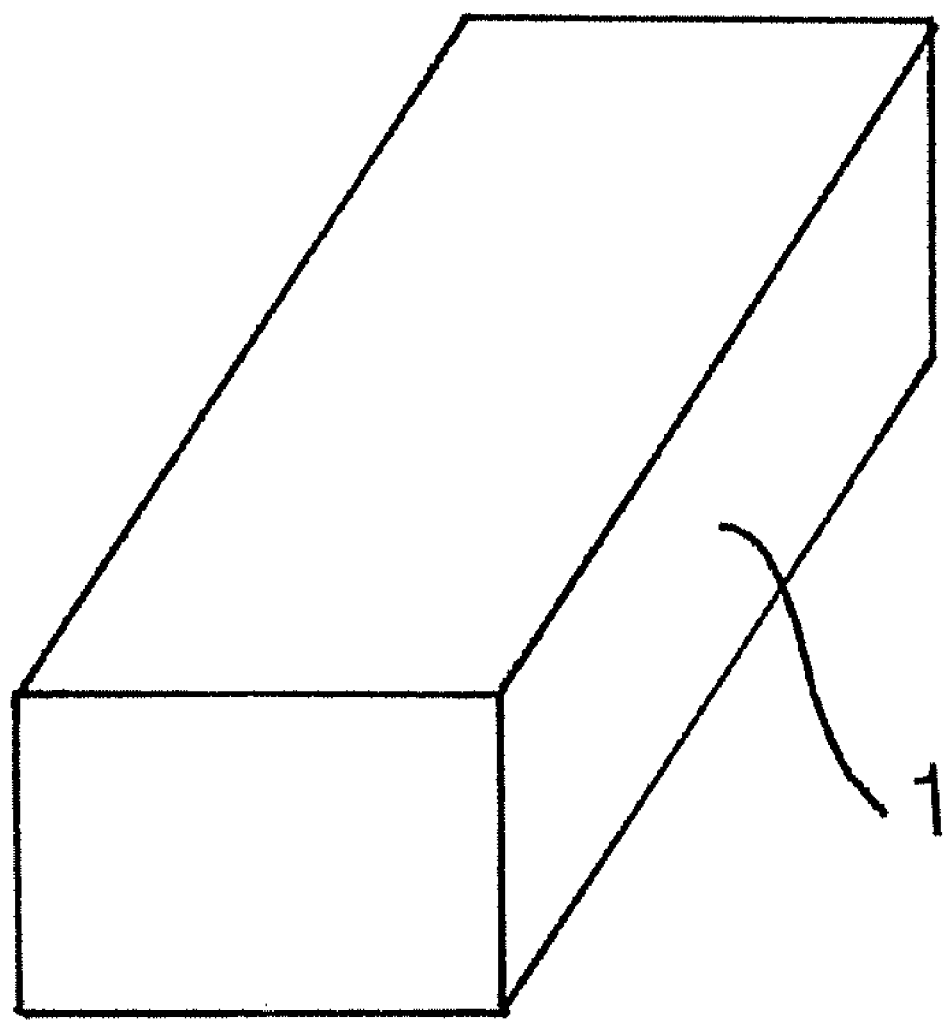
FIG. 4 shows a three-dimensional view of a SMD power component having a cuboidal form.

FIG. 4 shows a three-dimensional view of a SMD power 1 component having a cuboidal form.

The invention claimed is:

1. A cooling system for an electrical component, comprising:
 a board-shaped mounting substrate on which the electrical component is mounted on a side of the substrate;
 a heat sink configured as bent sheet-metal part assigned to the electrical component disposed on the same side of the substrate as the electrical component, wherein the bent sheet-metal part has at least one heat sink element extending in a longitudinal direction oriented obliquely to a plane of the substrate;
 a thermally conductive layer implemented on the substrate to thermally connect the heat sink with the electrical component; and a solder joint between the bent sheet-metal part and the thermally conductive layer, wherein the bent sheet-metal part has a U-shaped section with legs and ends of legs are connected to the thermally conductive layer based upon the solder joint, wherein the U-shaped section has end faces, and wherein the at least one heat sink element is formed by upwardly bent sheet-metal sections on a horizontal portion of each end face of the U-shaped section.

2. The cooling system as claimed in claim 1, wherein the electrical component is a SMD power component.

3. The cooling system as claimed in claim 2, wherein the substrate is a printed circuit board.

4. The cooling system as claimed in claim 1, wherein the at least one heat sink element is planar, having thermally conductive surfaces in acute angles with the plane.

5. The cooling system as claimed in claim 4, wherein the sheet-metal part is coated with a solderable surface.

6. The cooling system as claimed in claim 4, wherein the sheet-metal part is consists of a solderable material.

7. The cooling system as claimed in claim 1, wherein the at least one heat sink element is a cooling finger which fans out into space on a side of the mounting substrate, where the electrical component is mounted.

8. The cooling system as claimed in claim 1, wherein the SMD power component is cuboidal and the legs are disposed on the pairwise opposing sides of the SMD power component without terminal contacts.

9. The cooling system as claimed in claim 1, wherein the U-shaped sheet-metal part has a flat side.

10. The cooling system as claimed in claim 1, wherein the bent sheet-metal part is a punch-bended copper sheet.

11. The cooling system as claimed in claim 1, wherein the bent sheet-metal part is at least partially tin-coated.

12. The cooling system as claimed in claim 1, wherein the at least one heat sink element has a T-shape and angled end pieces.

13. A cooling system for an electrical component, comprising:

a board-shaped mounting substrate on which the electrical component is mounted on a side of the substrate;

a heat sink configured as bent sheet-metal part assigned to the electrical component disposed on the same side of the substrate as the electrical component, wherein the bent sheet-metal part has at least one heat sink element extending in a longitudinal direction oriented obliquely to a plane of the substrate;

a thermally conductive layer implemented on the substrate to thermally connect the heat sink with the electrical component; and a solder joint between the bent sheet-metal part and the thermally conductive layer, wherein the electrical component is a SMD power component, wherein the substrate is a punted circuit board, wherein the bent sheet-metal part has a U-shaped section with legs and ends of the legs are connected to the thermally conductive layer based upon the solder joint, wherein the U-shaped section has end faces, wherein the at least one heat sink element is formed by upwardly bent sheet-metal sections on a horizontal portion of each end face of the U-shaped section, wherein the at least one heat sink element is planar, having thermally conductive surfaces in acute angles with the plane, and wherein the at least one heat sink element has a T-shape and angled end pieces.

14. The cooling system as claimed in claim 13, wherein the at least one heat sink element is a cooling finger which fans out into space on a side of the mounting substrate, where the electrical component is mounted.

15. The cooling system as claimed in claim 13, wherein the sheet-metal part is coated with a solderable surface.

16. The cooling system as claimed in claim 13, wherein the sheet-metal part consists of a solderable material.

17. The cooling system as claimed in claim 13, wherein the SMD power component is cuboidal and the legs are disposed on the pairwise opposing sides of the SMD power component without terminal contacts.

18. The cooling system as claimed in claim 13, wherein the U-shaped sheet-metal part has a flat side.

19. The cooling system as claimed in claim 13, wherein the bent sheet-metal part is a punch-bended copper sheet.

20. The cooling system as claimed in claim 13, wherein the bent sheet-metal part is at least partially tin-coated.

* * * * *